United States Patent [19]

Mattei et al.

[11] Patent Number: 5,694,300

[45] Date of Patent: Dec. 2, 1997

[54] ELECTROMAGNETICALLY CHANNELIZED MICROWAVE INTEGRATED CIRCUIT

[75] Inventors: Carmelo J. Mattei, Mesa, Ariz.; Joseph S. Duthie, Algonquin, Ill.

[73] Assignee: Northrop Grumman Corporation, Los Angeles, Calif.

[21] Appl. No.: 626,305

[22] Filed: Apr. 1, 1996

[51] Int. Cl.[6] .................................................. H05K 9/00
[52] U.S. Cl. .......................... 361/818; 361/816; 174/35 R; 257/659; 257/660; 257/728; 427/96
[58] Field of Search .......................... 174/35 R, 35 GC; 361/816, 818; 257/659, 660, 728, 790; 427/96, 98, 404, 99

[56] References Cited

U.S. PATENT DOCUMENTS

| | | | |
|---|---|---|---|
| 5,151,770 | 9/1992 | Inoue | 357/53 |
| 5,166,864 | 11/1992 | Chitwood et al. | 174/35 R |
| 5,309,321 | 5/1994 | Olla et al. | 361/714 |
| 5,355,016 | 10/1994 | Swirbel et al. | 257/659 |
| 5,394,304 | 2/1995 | Jones | 361/765 |
| 5,461,545 | 10/1995 | Leroy et al. | 257/787 |
| 5,480,840 | 1/1996 | Barnes et al. | 437/209 |
| 5,566,055 | 10/1996 | Salvi, Jr. | 361/816 |
| 5,633,786 | 5/1997 | Matuszewski et al. | 361/818 |

FOREIGN PATENT DOCUMENTS

| | | | |
|---|---|---|---|
| 63-262860 | 10/1988 | Japan | 257/790 |
| 2-186662 | 7/1990 | Japan | 257/790 |
| 4-58596 (A) | 2/1992 | Japan | 361/818 |

*Primary Examiner*—Leo P. Picard
*Assistant Examiner*—John B. Vigushin
*Attorney, Agent, or Firm*—Terry J. Anderson; Karl J. Hoch, Jr.

[57] ABSTRACT

A multi-chip module (10) has a plurality of functional circuits each disposed within its own cavity (15–18), each cavity separated from the other by isolation channels (20, 21). Each functional circuit includes a plurality of monolithic microwave or high speed digital integrated circuit chips (29–33) which are wire bonded or flip-chip attached to the multi-chip module, and each is encapsulated in plastic (37) overmold compound. Complete electromagnetic shielding is provided by depositing metal (23) over the channels and the plastic encapsulation, thereby providing a totally electromagnetically channelized and shielded multi-circuit, microwave and/or high speed digital integrated circuit board.

6 Claims, 1 Drawing Sheet

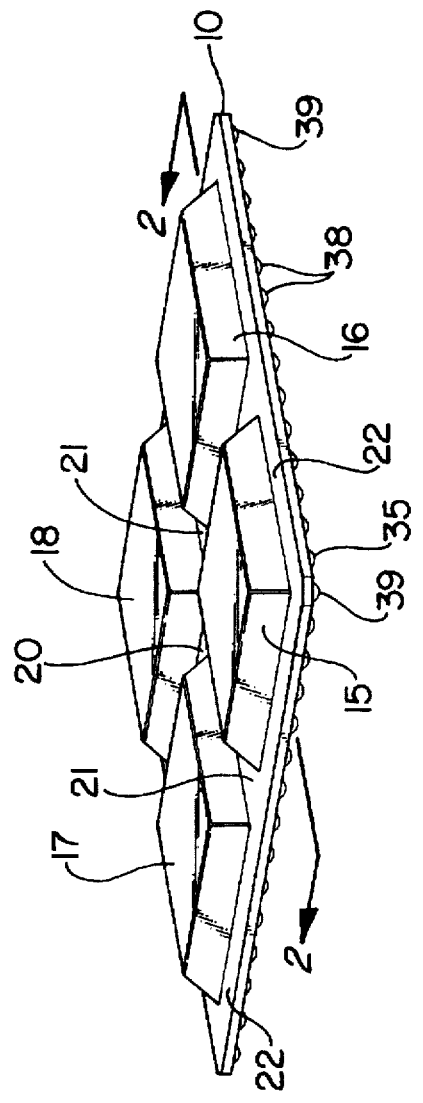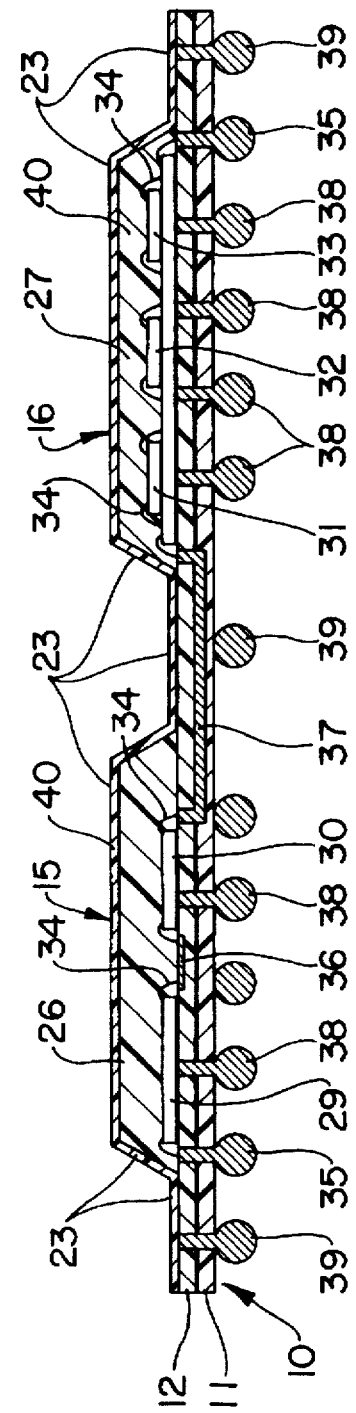

5,694,300

ELECTROMAGNETICALLY CHANNELIZED MICROWAVE INTEGRATED CIRCUIT

TECHNICAL FIELD

This invention relates to providing radio frequency (microwave and millimeter wave) shielding and isolation to surface mount ball grid array (BGA) or pin grid array (PGA) multi-function, multi-chip integrated modules by creating plastic overmolded metalized cavities separated from each other by grounding channels.

BACKGROUND ART

As used herein, the terms "channel", "channelized" and "channelization" refer to parametric isolation or separation of different elements of a multi-function module, particularly one which may include a plurality of gallium arsenide (GaAs) or silicon (Si) monolithic microwave integrated circuits (MMICs) or other application specific integrated circuits (ASICs). Examples of structures which require electromagnetic channeling include the following: 1) isolation between a number of individual dielectric loaded wave guide cavities; 2) multi-function circuits in which the RF energy needs to be contained and isolated from other circuit functions; and 3) high "Q" (Quality factor) resonator cavities. Applications requiring channelized packages/circuits include many commercial and military radio frequency (RF) and digital applications such as wireless modems, high speed digital computers and handheld radios to name only a few.

In this art it is desirable to utilize high volume manufacturing methods which are able to control parameters such as transmission line impedance. A particularly useful technology includes collapsing or non-collapsing ball grid arrays and pin grid arrays, which can be designed to provide controlled impedance feedthroughs at microwave and millimeter wave frequencies (hereinafter collectively referred to as microwave). In the prior art, providing electromagnetic channelization between various multi-chip functional circuits requires the use of machined metal packages, typically with screwed-on lids. Such channelized packaging is extremely expensive, heavy and cumbersome. Such packages are customized for each intended use, and not capable of serving a broad spectrum of circuit designs.

This invention provides a low cost alternative to machined metal packages and demonstrates a high level of compatibility to high volume low cost surface mount assembly technology.

DISCLOSURE OF INVENTION

Objects of the invention include provision of electromagnetic interference shielding and channelizing which is compatible with ball grid array and pin grid array multi-chip modules, high volume assembly techniques, and high packaging density, which is useful with laminate, ceramic or deposited multi-chip modules (MCM-L, MCM-C, and MCM-D respectively). Other objects of the invention include provision of improved isolation characteristics for microwave and high speed digital circuitry to enhance RF stability and noise immunity performance respectively.

According to the present invention, a plurality of microwave and/or high speed digital circuits, each comprising a plurality of integrated circuits, are formed on a multi-chip module mother board, each of said functional circuits being encapsulated with a plastic overmold compound, the plastic encapsulant and surfaces of the mother board between the edges of the mother board and the functional circuits, and between adjacent ones of said functional circuits, being metalized to provide complete electromagnetic shielding. In accordance with the invention, the metalization may have a thickness on the order of several hundred Angstroms to as much as 500,000 Angstroms or even greater. In accordance with the invention, the metalization may be deposited, to form the functional circuit cavities and microwave channelization, by means of a vapor deposited, sputtering, sprayed, painted or any other means of deposition, utilizing techniques which are well known in the art.

Other objects, features and advantages of the present invention will become more apparent in the light of the following detailed description of exemplary embodiments thereof, as illustrated in the accompanying drawings.

BRIEF DESCRIPTION OF THE DRAWINGS

FIG. 1 is a perspective view of a shielded, multi-cavity, electromagnetically channelized multi-chip module in accordance with the present invention.

FIG. 2 is a sectioned side elevation view taken on the lines 2—2 in FIG. 1.

BEST MODE FOR CARRYING OUT THE INVENTION

Referring now to FIG. 1, a multi-chip module may comprise a laminate, ceramic or deposited printed wiring board 10, which may comprise a plurality of layers 11, 12 (FIG. 2), having formed thereon a plurality of cavities 15–18 separated from each other and from the edge of the board 10, by electromagnetic channels 20–22, formed by a deposited layer of metal 23 (FIG. 2). The metalization 23 is deposited over the plastic (epoxy) overmold or syringed encapsulant 26, 27 which is deposited over the functional circuits within each of the cavities 15–18. Each of the functional circuits, within one of the cavities 15–18, comprises a plurality of gallium arsenide or silicon monolithic microwave and/or high speed digital integrated circuit chips 29–33 which are connected by wire bonds 34 to input/output vias 35, inter-chip metalization 36, inter-circuit metalization 37, and so forth. The vias may include thermal vias 38 that conduct heat away from the chips to the printed wiring board, to which the board 10 will become bonded, in a known fashion (i.e vapor phase reflow or belt furnace), and vias 39 that connect the metalization 23 of the present invention, and other parts of the circuitry, to package ground. Typically, the entire back side of the mother board, on which the apparatus of FIGS. 1 and 2 will be mounted, will have a metal backing ground plane to maintain the high degree of isolation established by the channelized multi-chip package.

The channelized structure of the embodiment of the invention herein is formed by first preparing the multi-circuit, ball grid array board 10, then mounting the integrated circuit chips 29–33 thereon and forming the wire bonds 34. Flip-chip integrated circuit interconnect technology may also be used in place of wire bonding. Then, a plastic encapsulant 40, such as that commonly used for high volume overmolded integrated circuits or other materials demonstrating dielectric properties, can be deposited over the entire board or selected sections requiring isolation from each other. The thickness of the plastic encapsulant 40 may vary depending upon the utilization of the invention, but may be on the order from one to five millimeters, depending on the desired waveguide function and frequency of operation of the circuit. Then, the metalization 23 is deposited over the entire board, utilizing a metal deposition process known in the art, referred to hereinbefore.

Thus, although the invention has been shown and described with respect to the exemplary embodiments thereof, it should be understood by those skilled in the art that the foregoing and various other changes, omissions and additions may be made therein and thereto, without departing from the spirit and scope of the invention.

We claim:

1. An electromagnetically channelized multi-circuit, microwave or high speed digital integrated circuit array comprising:

a substrate board having a surface and electric contacts;

a plurality of separate functional circuits, each comprising a plurality of monolithic microwave or digital integrated circuit chips disposed above said surface and electrically interconnected with each other and with said contacts;

a layer of plastic encapsulation material above said surface, said layer arranged in a plurality of distinct sections, each of said sections separated from the others of said sections, each of said sections corresponding to one of said functional circuits, each of said sections completely encapsulating the corresponding one of said functional circuits, said sections being disposed inwardly from the edges of said board; and a layer of metal on the order of several hundred Angstroms to several hundred thousand Angstroms thick disposed over said surface and said plastic encapsulation material which encloses each of said functional circuits in a metalized cavity and provides a metalized channel surrounding each of said functional circuits.

2. An array according to claim 1 wherein the thickness of said layer of metal is on the order of several hundred Angstroms to several thousand Angstroms.

3. A method of making an electromagnetically channelized multi-circuit, microwave or high speed digital integrated circuit array comprising:

providing a substrate board having a surface and electric contacts;

mounting a plurality of separate functional circuits, each comprising a plurality of monolithic microwave integrated circuit chips disposed above said surface;

electrically interconnecting said circuit chips with each other and with said contacts;

depositing a layer of plastic encapsulation material above said surface in a plurality of distinct sections, each of said sections separated from the others of said sections, each of said sections corresponding to one of said functional circuits, each of said sections completely encapsulating the corresponding one of said functional circuits, said sections being disposed inwardly from the edges of said board; and depositing a layer of metal over said surface and over said plastic encapsulating material thereby to enclose each of said functional circuits in a metal cavity and provide a metalized channel surrounding each of said functional circuits.

4. A method according to claim 3 wherein said last depositing step comprises depositing a layer of metal on the order of several hundred Angstroms thick or greater over said surface and over said plastic encapsulation material.

5. An electromagnetically channelized multi-circuit, microwave or high speed digital integrated circuit array comprising:

a substrate board having a surface and electric contacts;

a plurality of separate functional circuits, each comprising a plurality of monolithic microwave or digital integrated circuit chips disposed above said surface and electrically interconnected with each other and with said contacts;

a layer of plastic encapsulation material above said surface, said layer arranged in a plurality of distinct sections, each of said sections separated from the others of said sections, each of said sections corresponding to one of said functional circuits, each of said sections completely encapsulating the corresponding one of said functional circuits, said sections being disposed inwardly from the edges of said board; and a single deposited layer of metal on the order of several hundred Angstroms thick or greater disposed over said surface and said plastic encapsulation material which both completely encloses each of said functional circuits in a totally metalized cavity and provides a unitary, completely metalized channel which surrounds each of said functional circuits.

6. An array according to claim 5 wherein the thickness of said layer of metal is on the order of several hundred Angstroms to several thousand Angstroms.

* * * * *